(12) United States Patent
Jacobson et al.

(10) Patent No.: US 6,714,040 B1
(45) Date of Patent: Mar. 30, 2004

(54) AUTOMATED BOUNDARY-SCAN CHAIN COMPOSITION METHOD USING A DEVICE DATABASE AND ACCESS MECHANISM FOR STORING AND RETRIEVING SITUATION-DEPENDENT OPERATION OPTIONS

(75) Inventors: Neil G. Jacobson, Mountain View, CA (US); Emigdio M. Flores, Jr., Coral Springs, FL (US); Sanjay Srivastava, San Jose, CA (US); Bin Dai, Moutain View, CA (US); Sungnien Jerry Mao, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/162,240

(22) Filed: Jun. 3, 2002

(51) Int. Cl.$^7$ .............................................. H03K 19/177
(52) U.S. Cl. ............................ 326/38; 326/37; 326/40
(58) Field of Search ................................ 326/37–41, 16

(56) References Cited

U.S. PATENT DOCUMENTS

| | | |
|---|---|---|
| 5,635,855 A | 6/1997 | Tang |
| 5,999,014 A | 12/1999 | Jacobson et al. |
| 6,102,963 A * | 8/2000 | Agrawal ...................... 716/17 |
| 6,259,271 B1 * | 7/2001 | Couts-Martin et al. ....... 326/40 |

* cited by examiner

*Primary Examiner*—Anh Tran
(74) *Attorney, Agent, or Firm*—Patrick T. Bever; Edel M. Young

(57) ABSTRACT

A method for programming a series of in-system programmable devices that uses Boundary-Scan techniques to read device identification codes from each device of a system, and to automatically generate a board/device information file including a record for each device arranged in the order in which the devices are chained in the system. The device identification codes are then used to automatically retrieve device specifications from a central database. When no identification code is provided from the device, or the database fails to include specifications for a particular device, the user is prompted to enter minimum information or specifications necessary to carry out communications with the device. After device specifications are entered for each device, the user is prompted to enter configuration data, which is automatically matched to its associated device, and compared for consistency with the device specifications. After verifying the configuration data, programming is performed using the configuration data.

18 Claims, 7 Drawing Sheets

US 6,714,040 B1

AUTOMATED BOUNDARY-SCAN CHAIN COMPOSITION METHOD USING A DEVICE DATABASE AND ACCESS MECHANISM FOR STORING AND RETRIEVING SITUATION-DEPENDENT OPERATION OPTIONS

FIELD OF THE INVENTION

The present invention relates generally to the field of programmable logic devices and more particularly to an improved method for effecting operations on a plurality of in-system programmable logic devices.

BACKGROUND OF THE INVENTION

IEEE Standard 1149.1 and 1a entitled IEEE Standard Test Access Port and Boundary-Scan Architecture, published Oct. 21, 1993 by the IEEE under ISBN 1-55937-350-4 relates to circuitry that may be built into an IC device to assist in testing the device as well as testing the printed circuit board in which the device is placed. In particular, the standard provides for testing IC devices connected in series (commonly referred to as a daisy chain or BSL chain).

FIG. 1 shows a system including three devices (devices 1 through 3) that are controlled by a test data input signal TDI, a test mode select signal TMS, and a test clock signal TCK, and generate a test data output signal TDO. The TDI signal entering the system is applied to device 1, which generates a test data output signal TDO that is applied to device 2, which in turn is connected through device 3 to generate the system TDO signal, thereby forming a daisy chain. All data and instructions for all devices are loaded into the data input port of device 1 and shifted into each device of the chain. This system complies with IEEE Standard 1149.1.

The test mode select signal TMS and the clock signal TCK control a 16-state state machine shown in FIG. 2 that is within each IC device, which meets IEEE Standard 1149.1, and controls shifting in of the data. On each rising edge of clock signal CLK; the state of test mode select signal TMS is inspected by a state machine within the IC device. (Such state machines are well known and are not discussed here.) FIG. 2 shows movement through the states based on the TMS signal at the rising edge of CLK. As shown in FIG. 2, five consecutive high (logic 1) TMS signals place the state machine into STATE 1, the Test-Logic Reset state. From there, a single low signal or a continuous low signal places the state machine into STATE 2, the Run-Test Idle state in which no action occurs but from which action can be initiated more quickly.

Loading data into the data registers of the devices will now be discussed. From STATE 2 (FIG. 2), a single logic 1 moves the state machine to STATE 3, the Select-DR-Scan state, which is a path select state from which loading of data registers can be initiated. One logic 0 signal initiates STATE 4, from which initializing data are loaded in parallel from an internal register. Next, a logic 0 signal initiates STATE 5, the Shift-DR state, which is held by logic 1 TMS signals while serial data are shifted into a shift register or registers. After serial shifting of data, a logic 1 followed by logic 0 causes a pause at STATE 7. Another 10 returns to STATE 5 for more loading of serial data. Following STATE 5 or STATE 7, two logic 1's initiate STATE 9 in which the appropriate data registers are actually updated. While the state machine is in STATE 9, data that have been shifted into the IC are latched into the data registers on the falling edge of TCK. From here continuous high signals return the state machine to STATE 1, the Test-Logic Reset state, and continuous low signals return to STATE 2, the Run-Test Idle state.

Loading instruction data into the instruction registers of the devices will now be discussed. From STATE 2, two logic 1 signals prepare for capturing instructions into the instruction register by moving the state machine to STATE 10, the Select-IR-Scan state. A logic 0 then initiates STATE 11, the Capture-IR state, and a logic 0 then initiates STATE 12 in which instruction data are shifted into the instruction register while the TMS signal remains at logic 0. State 14 allows for a pause in the shifting of instructions into the instruction register, and STATE 16 causes the actual latching of the instructions into the instruction register, on the falling edge of TCK. Once the new instruction has been latched, it becomes the current instruction.

Programming, erasing, or reading back data from the devices will now be discussed. Some PLD devices are programmed by writing data into volatile memory cells, while other PLDs are programmed by writing data into nonvolatile memory cells such as EPROM cells or flash cells. Generally, these devices can be programmed using the IEEE standard discussed above. The programming step involves raising voltages at certain transistor gates to a high level and maintaining the high level until sufficient charge has flowed onto or away from a floating gate of the transistor to cause the transistor to maintain a certain state when the high voltage is removed. Typically, a stream of data from ten to several hundred bits long can be shifted into several devices in less time than is required to program a transistor (cell) in a device. Thus a practical and widely used programming procedure is to serially shift an instruction and then a unit of programming data through a daisy chain of devices (STATEs 5 and 12 of FIG. 2) and then move into a programming mode (usually occurs in STATE 2 of FIG. 2 when entered from STATE 9 or STATE 16) during which all addressed EPROM, EEPROM, or flash transistors (cells) are programmed simultaneously as specified by the programming data. This method is practical and efficient when all devices in the daisy chain are the same size and have the same requirements for programming time and programming voltage. However, the devices are often unequal in size.

Referring again to FIG. 1, configuration information (parameters) associated with each of the devices 1 through 3 is indicated for reference. For example, assume device 1 includes 500 addresses (#A=500), each address having a programming time TP=200 ms, where TP is the time required to program one address location. Device 1 also includes a four-bit data register 11 (RL=4) that stores shifted-in data for programming into a group of four bits associated with a selected address A0–A499 of device 1 includes four bits that are written from a four-bit data register 11. Further, device 1 includes an instruction register 12 for storing instructions shifted in the boundary scan chain. Assume also that device 2 has 1000 addresses, a TP=100 ms and an eight-bit data register 21, and that device 3 has 2000 macrocells, a TP=50 ms, and a sixteen-bit data register 31. Devices 2 and 3 have instruction registers similar to instruction register 12. The number of addresses defines the logic capacity of the PLD. During the programming process, configuration data representing one word (equal to the data register length) for each device is combined into a bit stream that is shifted into the data registers 11, 21, and 31 of the devices, and then programming is performed.

A problem with conventional programming tools is that the user is left to manually identify and arrange the configuration data associated with the devices of a system. This manual process is a problem because if the user misidentifies the order in which the devices are chained in the system, then, for example, 8-bit data intended for device 2 may be inadvertently programmed into eight bits of the sixteen bit data register 31 of device 3. When errors are made during this manual data entry process, the total programming time for programming the system shown in FIG. 1 is greatly increased, thereby increasing total manufacturing costs.

What is needed is an improved method of entering configuration data for in-system PLDS that avoids the costly errors associated with conventional methods.

SUMMARY OF THE INVENTION

The present invention is directed to a method for programming a series of in-system programmable devices that automatically generates device information files that facilitate fast and accurate programming of the devices, thereby greatly reducing the total programming time needed to program the system and reducing total manufacturing costs.

In accordance with an embodiment of the present invention, the method uses the Boundary-Scan IDCODE instruction to automatically read device identification codes from each device of a system. These device identification codes are then used to form a device information file that is used to collect and check the configuration data submitted for each device. In particular, the device identification codes are used to read device programming specifications from a centralized database, which are then stored in the device information field. When a device does not provide a device identification number in response to the IDCODE instruction, or when the database fails to provide specifications for a particular device, the user is prompted to enter device specification data that is automatically stored in the device information file (and, when a device identification code is available, in the centralized database for future reference). The user is then prompted to enter configuration data, which is automatically checked against the device specifications to make sure that the configuration data is entered correctly. Finally, when the configuration data is entered correctly, programming is executed using a selected programming tool. With the order of devices automatically set by the present method, proper sequencing of the configuration data during programming is assured. Accordingly, the method of the present invention greatly speeds up the configuration process while reducing the chances of incorrect sequencing the configuration data during the programming operation.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

Figure 3:
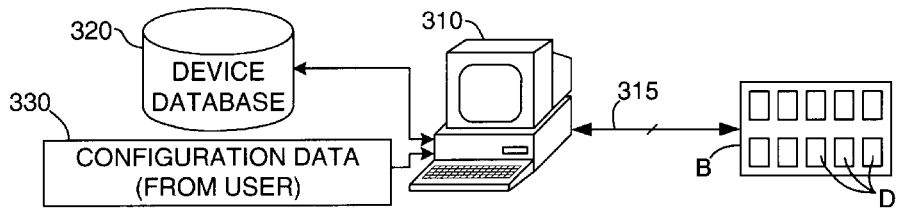
FIG. 3 is a simplified block diagram showing an arrangement for programming devices in accordance with the present invention.

FIG. 3 is a simplified block diagram showing an arrangement for programming devices mounted on a system board B in accordance with the present invention. System board B includes a set of devices D mounted thereon that are connected in compliance with IEEE Standard 1149.1, as discussed further below. The arrangement includes a computer or workstation 310 for performing the device grouping and programming functions described below. In particular, computer 310 accesses a central device database 320 and device configuration (programming) data 330 from an external source (i.e., a user) according to known techniques. As described in additional detail below, device database 320 is used to provide device information to a board/device information file that greatly simplifies the board programming process by automatically prompting, verifying and storing configuration data 330 in the board/device information file. Configuration data 330 and associated programming information are then recalled from the board/device information file, and a series of instructions and data streams are then transmitted to devices D of board B during a programming process over a Boundary-Scan bus 315.

Figure 1:
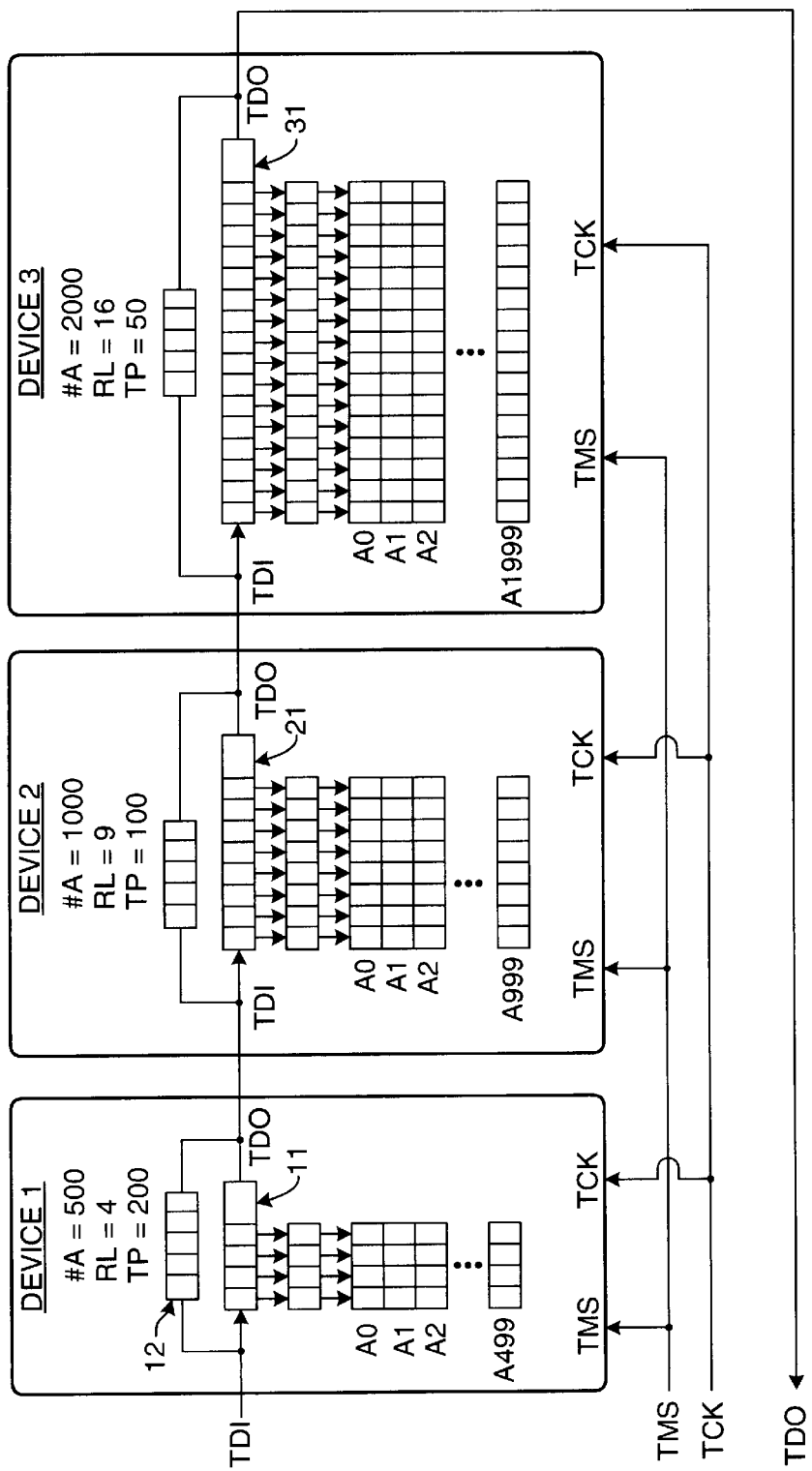
FIG. 1 is a block diagram showing a simplified system including three programmable logic devices.
Figure 2:
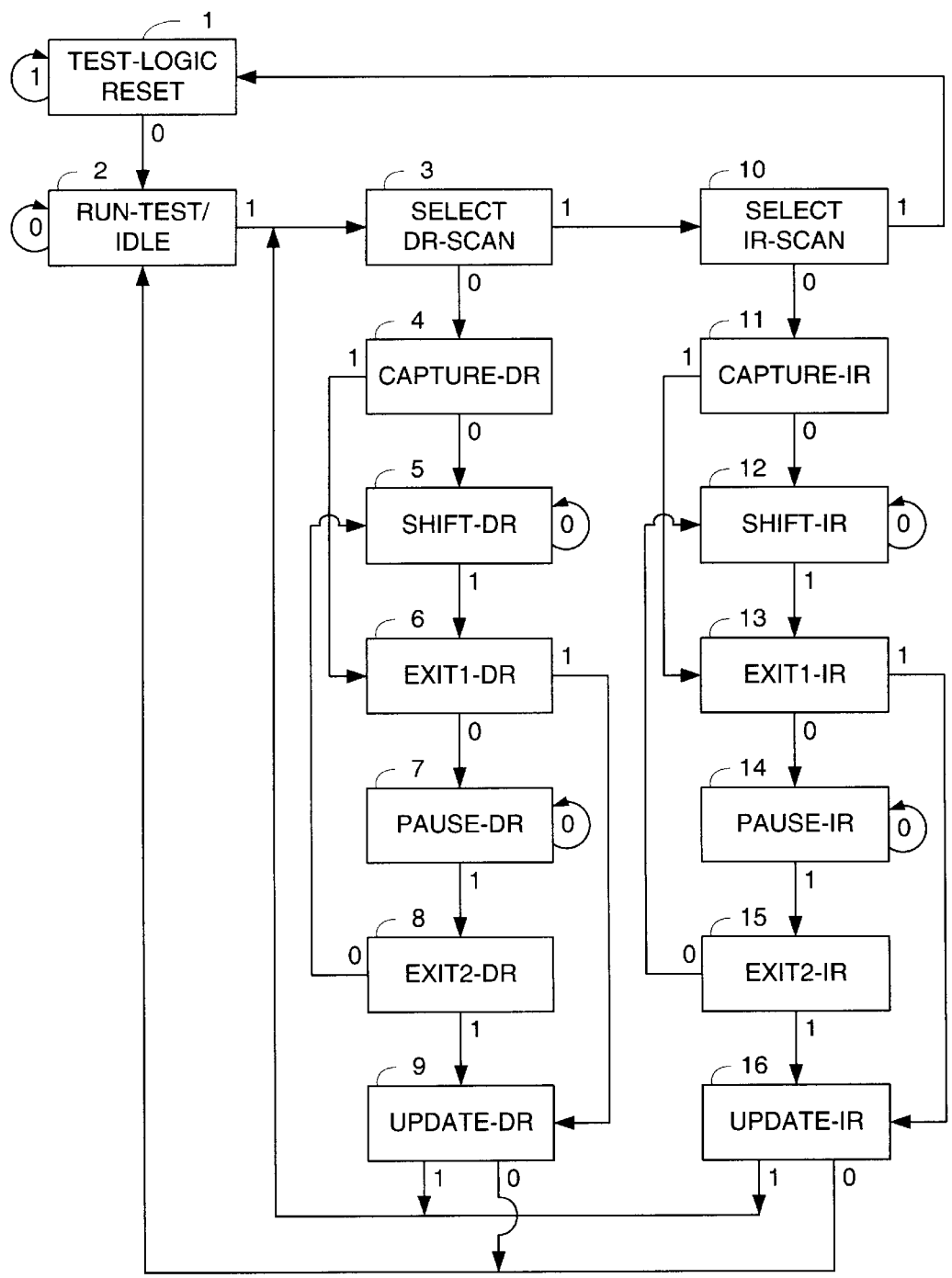
FIG. 2 shows the TAP controller state machine controlled by TMS and TCK signals according to the IEEE Standard 1149.1.
Figure 4:
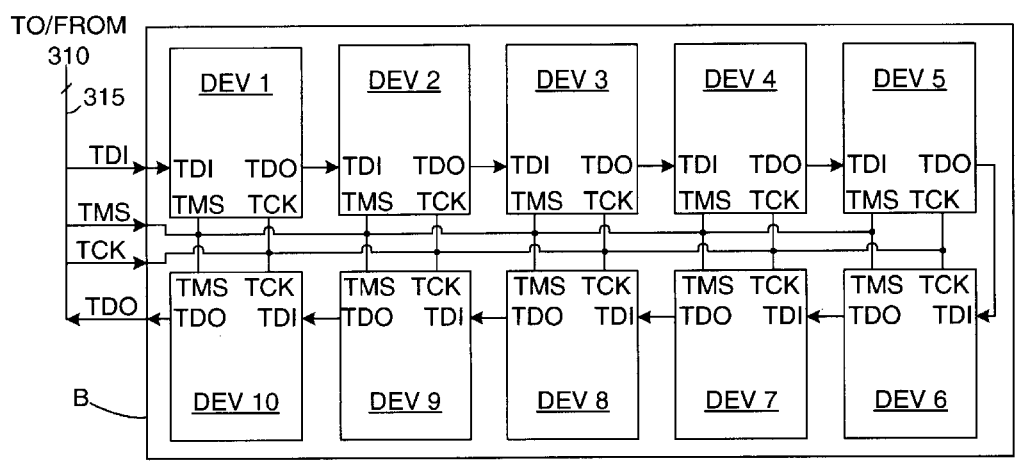
FIG. 4 is a simplified block diagram showing an exemplary arrangement of devices mounted on a system board.

FIG. 4 shows an exemplary board B in additional detail. Board B includes ten devices DEV 1 through DEV 10, which are connected to receive four signals from bus 315: a test data input signal TDI, a test data output signal TDO, a test mode select signal TMS, and a test clock signal TCK. Devices DEV 1 through DEV 10 are connected in compliance with IEEE Standard 1149.1 to pass programming and/or test signals between the devices of board B and computer 310 (see FIG. 3) during programming operations. In particular, programming data and/or instruction data are transmitted from one device to the next device to create the daisy chain. Because devices DEV 1 through DEV 10 are arranged in a specific order on board B, each instruction or block (word) of configuration data must be arranged properly in the data stream so that it is shifted properly into its target device. This programming process is performed in accordance with the state machine described above with reference to FIG. 2. After programming is completed and tested, "normal" operations are initiated in which devices DEV 1 through DEV 10 communicate over system connections (not shown) that are provided on board B. These system connections that facilitate communications between devices DEV 1 through DEV 10 during "normal" operations are omitted from FIG. 4 for brevity.

Figure 5:
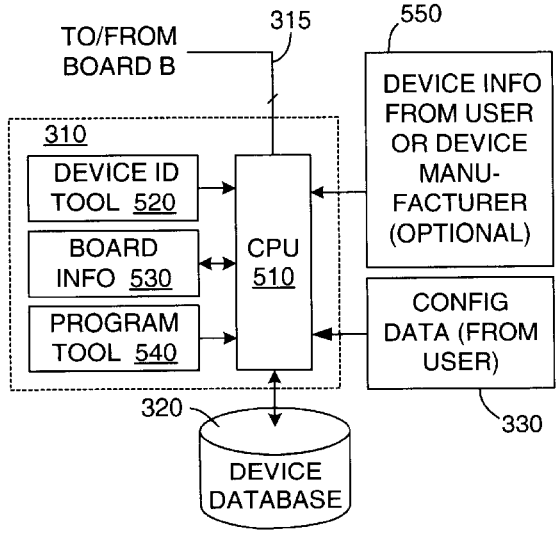
FIG. 5 is a simplified block diagram showing a system for programming devices in accordance with an embodiment of the present invention.

FIG. 5 is a simplified block diagram showing computer 310 in additional detail. As mentioned above, computer 310 incorporates a central processing unit (CPU) 510 that is controlled by instructions provided by a device identification tool 520 to perform the device identification function of the present invention, a board/device information files 530 that is formed during operation of the device identification tool, and a programming tool 540 that uses the completed board/device information file 520 for performing programming operations. Note that device database 320 may be a central database accessible, for example through a standard network connection (e.g., a local area network or a wide area network, such as the Internet), or may be connected directly to or part of computer 310. Note also that, in addition to configuration data 330, one or more pieces of device information 550 may be entered manually or through a network connection (e.g., the Internet) when information for a particular device is not already stored in device database 320.

Figure 6:
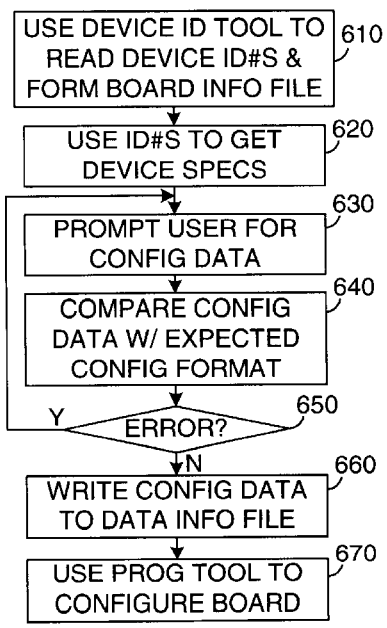
FIG. 6 is a flow diagram showing a method for programming devices in accordance with an embodiment of the present invention.

FIG. 6 is a flow diagram showing a method for operating computer 310 to automatically form a board information file and program the devices of a system, such as devices DEV 1 through DEV 10 of board B (see FIG. 4), in accordance with the present invention.

As indicated at the top of FIG. 6, the method begins by using device tool 520 (FIG. 5) to read device identification numbers (ID#s) from each device DEV 1 through DEV 10 (block 610). In particular, device identification tool 520 is loaded into CPU 510 according to known techniques, and then uses established techniques (described below) to access board B using bus 315.

Figure 7:
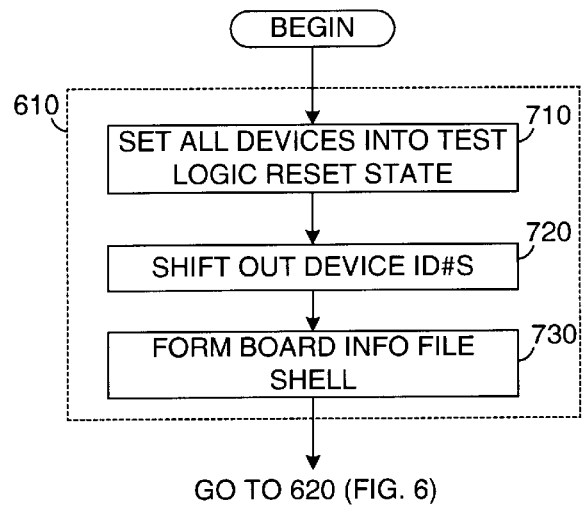
FIG. 7 is a flow diagram showing a process for reading device identification codes and forming an associated device identification file shell in accordance with an embodiment of the present invention.

FIG. 7 is a flow diagram showing the process of reading device identification numbers according to an embodiment of the present invention. In this embodiment, reading device identification numbers is performed by setting all of devices DEV 1 through DEV 10 into the Test-Logic Reset state by holding the TMS signal high for five pulses (i.e., five clock cycles of the TCK signal). When a device supports the IEEE Standard 1149.1 IDCODE instruction, entering the Test-Logic Reset state causes that device to load itself with the IDCODE instruction and to write out its 32-bit identification code (specifically, a "1" followed by a 31-bit identification code). If a device does not support the IDCODE instruction, that device will execute a BYPASS instruction (i.e., that device will shift out a single "0" bit). Note that the IDCODE instruction is a special purpose instruction defined under IEEE Standard 1149.1. The identification codes and bypass bits are then used to generate a board information file shell (block 730) into which configuration information will be arranged and stored for the subsequent programming process.

Figure 8:
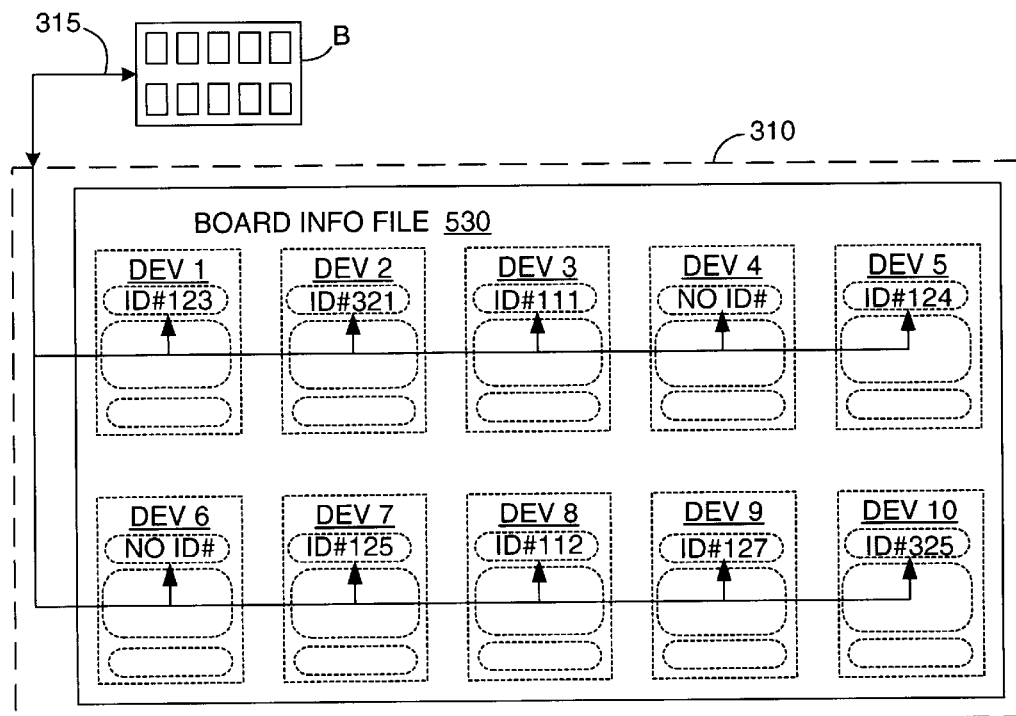
FIG. 8 is a diagram depicting a board/device information file shell using the method of FIG. 7.

FIG. 8 is a simplified diagram showing the formation of board information file 530 after the device identification reading process (block 610, discussed above). Before the device identification reading process, board information file 530 is made up of a reserved portion of addressable memory in computer 310. As indicated in FIG. 8, after the device identification numbers are shifted out of the devices (block 720, FIG. 7), the device identification tool is able to automatically count the number of devices on board B by counting the number of identification codes and bypass codes that are shifted out of board B. Accordingly, ten records are established for devices DEV 1 through DEV 10. Note also that the order in which these devices are arranged is established from the order in which the device identification codes are read from board B. As discussed below, this device order is subsequently used to properly sequence configuration data words during programming.

Referring to block 620 of FIG. 6, after reading the device identification information and forming the board/device information file shell, device identification tool 520 then uses the device identification codes to obtain device (specification) information from device database 320 (see FIG. 5). In accordance with the present invention, device database 320 is a database that stores device information (e.g., a JEDEC file). In alternative embodiments, device database 320 may stored and maintained either by the user (e.g., stored in computer 310, or in a server accessible through a local area network by computer 310), or by a third party source (e.g., such that device database 320 is accessible over the Internet).

Figure 9:
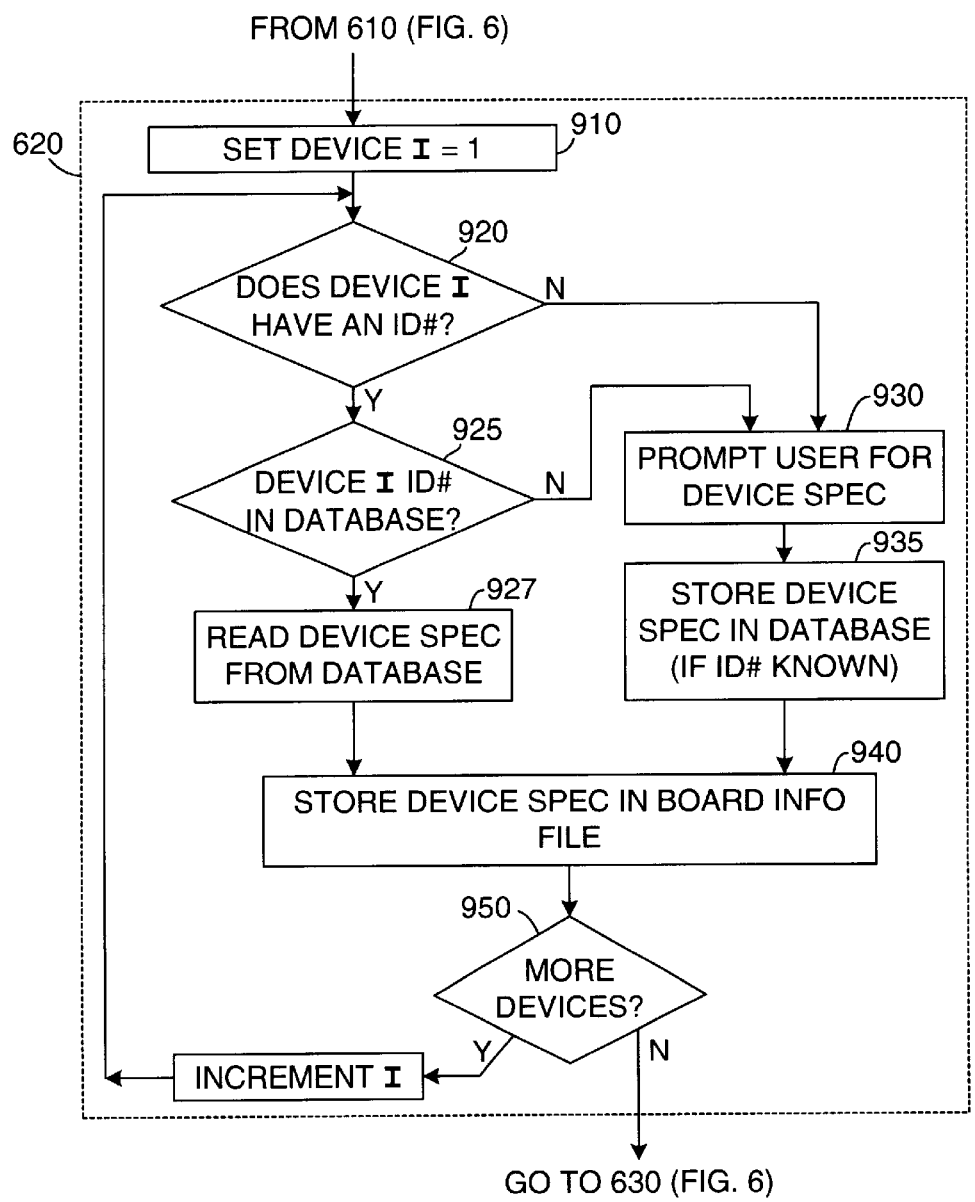
FIG. 9 is a flow diagram showing a process for reading device specifications from a central database and/or device specifications provided by a user in accordance with an embodiment of the present invention.

FIG. 9 is a flow diagram showing the device information reading process of block 620 (FIG. 6) in accordance with an embodiment of the present invention. After initializing a device variable I (block 910), a first device is selected from board information file 530 (block 920). If the device record for the selected device includes a device identification number (i.e., a device identification number was read from the device during the process of block 610; see FIG. 6), then device database 320 is queried for device specifications that are related to the configuration of that device (block 925). In one embodiment, the device specifications are stored according to device identification number, so this process involves checking device database 320 for the device identification number. If device specifications are stored in device database 320 for the selected device, the device specifications for the selected device are read from device database 320 (block 927), and then stored in the associated record of board/device information file 530 (block 940). Returning to blocks 920 and 925, if the selected device did not provide a device identification number (No in block 920), or if the selected device provided a device identification number that does not have a corresponding record in device database 320 (No in block 925), the device identification tool queries the user for a minimum amount of information necessary to establish communications through the device (block 930). Note that this minimum information may include only enough information to bypass the device during programming (i.e., the device does not include programmable elements), or may include device specifications necessary to program that device. The device specifications may be obtained (e.g., downloaded) from the device manufacturer, or entered manually from a printed source. If the device identification number is known, the user-provided device specifications are then written to device database 320 for future reference (block 935). Finally, the device specifications for the selected device tat obtained from either device database 320 or the user are written into the associated record of board/device information file 530 (block 940), and then the process is repeated for each device (block 950).

Figure 10:
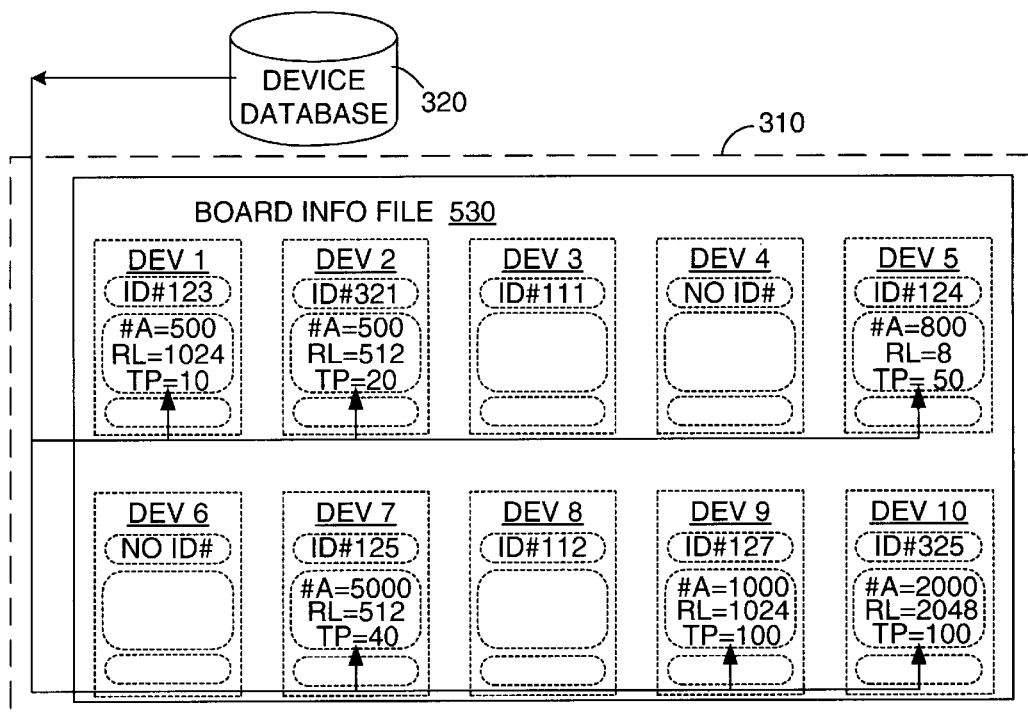
FIG. 10 is a diagram depicting a board/device information file incorporating information read from a central database using the method of FIG. 9.
Figure 11:
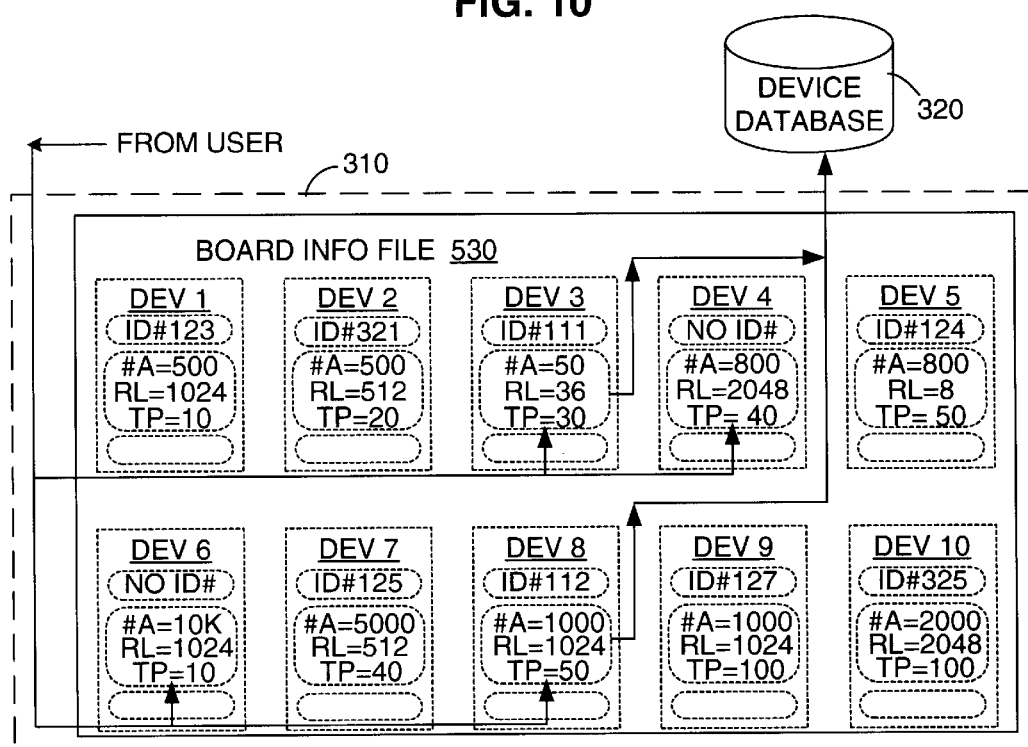
FIG. 11 is a diagram depicting a board/device information file incorporating information received from a user using the method of FIG. 9.

FIGS. 10 and 11 are diagrams depicting board/device information file 530 as it incorporates device specifications received from device database 320 or from the user.

FIG. 10 depicts the process corresponding to block 927 of FIG. 9. Specifically, when a device identification number is read from the selected device and device database 320 includes device specifications corresponding to that device specification number, device identification tool 510 automatically reads the device specification data and loads the device specification data into the record associated with the selected device (shown for devices DEV 1, DEV 2, DEV 5, DEV 7, DEV 9 and DEV 10). For example, the device specifications associated with device DEV 1 indicate that device has 500 addresses (#A=500) of programmable cells, a register length of 1024 (RL=1024), and a program (burn)

time of 10 microseconds (TP=10). Similarly, device DEV 2 includes 500 addresses (#A=500), a register length of 512 (RL=512), and a program (burn) time of 20 microseconds (TP=20). Note that the present example assumes no device specifications are stored for devices DEV 3 and DEV 8, even though these devices have device identification numbers. Similarly, no device specifications are read for devices DEV 4 and DEV 6, which do not have device identification numbers.

FIG. 11 depicts the process corresponding to blocks 930 and 935 of FIG. 9. Specifically, when a device identification number is not read from the selected device or device database 320 does not include device specifications corresponding to that device specification number, device identification tool 510 prompts the user for minimum information or device specifications. These device specifications are written into the records associated with the selected device (shown for devices DEV 3, DEV 4, DEV 6, and DEV 8). In addition, when the selected device provides a device identification number (e.g., devices DEV 3 and DEV 8), the device specifications are also written into device database 320 (as indicated by arrows).

Returning to FIG. 6, after device specifications are written into each record of board/device information file 530, device identification tool 520 prompts the user for configuration data to be programmed into each device (block 630). As the configuration data is entered by the user, it is compared against the device specifications to assure that the configuration data matches that which is expected (block 640). For example, the number of configuration bits in the configuration data file is compared against the number of addresses in the device specification. If the configuration data file is inconsistent with the device specifications for that device, an error message is generated prompting the user to enter a correct configuration data file (block 650). Otherwise, the configuration data is written into a corresponding record of board/device information file 530 (block 660).

Figure 12:
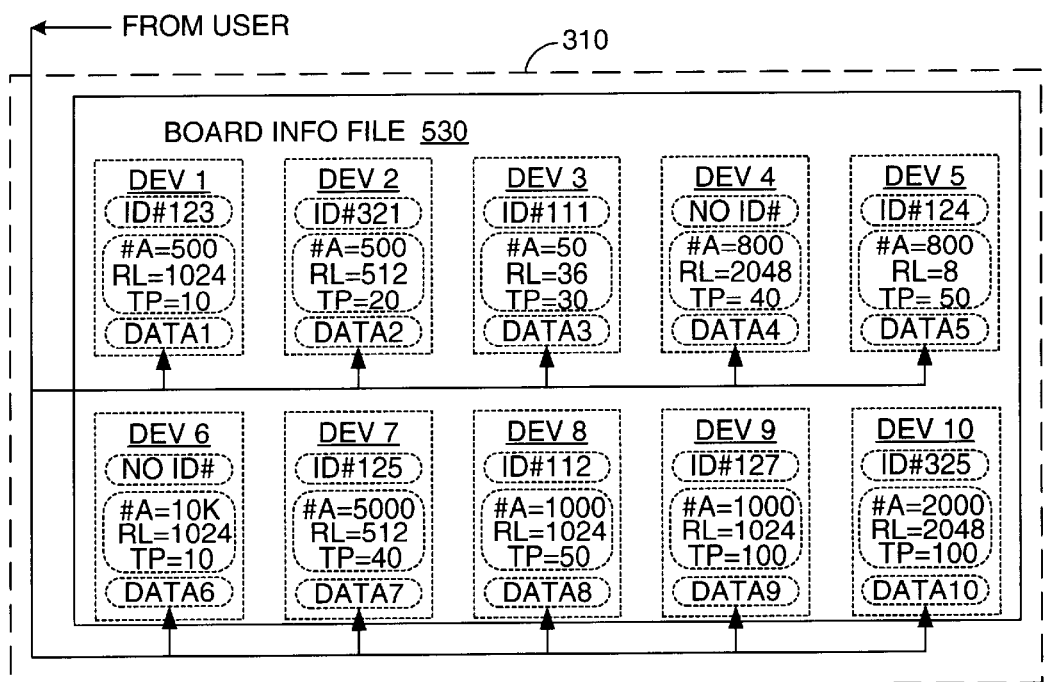
FIG. 12 is a diagram depicting a board/device information file incorporating configuration data received in accordance with an embodiment of the present invention.

FIG. 12 is a simplified diagram depicting the entry of configuration data into corresponding fields of board/device information file 530 according to the process of block 660 (FIG. 6). Note that the configuration data provided by the user completes the records associated with each device, thereby facilitating automated programming of the devices.

Returning to FIG. 6, upon completing the records associated with each device, programming tool 540 (see FIG. 5) is loaded into CPU 510 according to known techniques, and is then used to program the devices of board B over bus 315. In accordance with one embodiment, programming of board B is performed using the programming method set forth in U.S. Pat. No. 5,999,014 to Jacobson et al (Jacobson '014). Jacobson '014 discloses a method for concurrently accessing in-system PLDs for program, erasure or readback, and accommodates retries to assure completion of programming even when the initial attempt is not entirely successful. According to the method disclosed in Jacobson '014, where there are devices having different numbers of programmable memory cells, and whose memory cells require different wait periods to carry out programming, the method provides for programming only the devices requiring programming at the rate required by the slowest of the devices requiring programming. In accordance with another embodiment, programming of board B is performed using the programming method set forth in co-pending U.S. patent application Ser. No. 10/162,008 to Jacobson et al. entitled "METHOD FOR CONCURRENTLY PROGRAMMING A PLURALITY OF IN-SYSTEM-PROGRAMMABLE LOGIC DEVICES BY GROUPING DEVICES TO ACHIEVE MOST EFFECTIVE CONFIGURATION TIME", filed herewith. This method is similar to Jacobson '014, but groups the devices into sequentially-programmed groups such that a optimal or best-possible grouping of devices is determined before programming is commenced that achieves a most effective total configuration time. The method determines the optimal or best grouping by comparing the total configuration times of several possible groupings, and selecting the grouping having the best (smallest) total configuration time. Once a best grouping is determined, programming is performed by selecting a first group from the grouping and programming the first group while bypassing devices of all other groups. Once the first group is programmed, a next group is programmed, and so on, until all of the groups are programmed.

Although the present invention has been described with respect to certain specific embodiments, it will be clear to those skilled in the art that the inventive features of the present invention are applicable to other embodiments as well, all of which are intended to fall within the scope of the present invention. For example, in another possible embodiment, device identification tool 520 may also be used to identify programming modes associated with the devices, and restrict the program mode choices presented to the user. This may be necessary where the programmable devices, such as those produced by Xilinx, Inc., of San Jose, Calif., support several programming modes (e.g., serial or parallel data transmission). The particular programming apparatus used to program board B may not support one or more of the programming modes. Accordingly, device identification tool 520 may be used to compare the programming mode options associated with the devices with the capabilities of the programming tool, and to make certain that the user only sees those programming modes applicable to the current device/cable situation. In this alternative embodiment, device identification tool 520 looks up the rules associated with the download cable and programming tool, in addition to the device specifications, and returns only allowable operations for the selected devices.

What is claimed is:

1. A method for programming a plurality of in-system logic devices, the method comprising:

reading device identification codes from each of the plurality of devices;

reading device specifications from a database using the device identification codes;

comparing configuration data associated with each device with the device specifications corresponding to said each device; and programming the plurality of devices using the entered configuration data if the entered configuration data for each device is consistent with the specifications corresponding to said each device.

2. The method according to claim 1, wherein reading device identification codes comprises causing the plurality of devices to transmit associated device identification codes.

3. The method according to claim 2, wherein the plurality of devices are connected in a Boundary-Scan chain, and wherein causing transmission of the device identification codes comprises:

setting the plurality of devices into a Test-Logic Reset state, thereby causing the plurality of devices to read out the associated device identification codes; and shifting out the device identification codes from the plurality of devices.

4. The method according to claim 1, further comprising using the device identification codes to generate a board/ device information file including a device record for each of the plurality of devices.

5. The method according to claim 1, wherein reading the device specifications for each device comprises searching the database for device specifications associated with the device identification number associated using said each device, and downloading the device specifications when the database includes said device specifications for the associated device identification number.

6. The method according to claim 5, wherein reading the device specification further comprises prompting the user to enter said configuration data for said each device when the database fails to include said device specifications for the associated device identification number.

7. The method according to claim 1, wherein reading the configuration data comprises prompting the user to enter said configuration data for said each device when the database fails to include said device specifications for the associated device identification number.

8. The method according to claim 1, further comprising prompting a user to enter the configuration data for each device, and storing the configuration data in a board/device information file associated with said each device.

9. The method according to claim 5, wherein comparing the configuration data comprises comparing the number of bits of said configuration data to a number of programmable cells identified in the device specifications associated with said each device.

10. A method for programming a plurality of in-system logic devices, the method comprising:

reading device identification codes from each of the plurality of devices;

using the device identification codes to generate a board/device information file including a device record for each of the plurality of devices;

storing device specifications and configuration data for each device of the plurality of devices in the record associated with said each device;

comparing the configuration data of each device with the device specifications corresponding to said each device; and programming the plurality of devices using the entered configuration data if the entered configuration data for each device is consistent with the specifications corresponding to said each device.

11. The method according to claim 10, wherein reading device identification codes comprises causing the plurality of devices to transmit associated device identification codes.

12. The method according to claim 11, wherein the plurality of devices are connected in a Boundary-Scan chain, and wherein causing transmission of the device identification codes comprises:

setting the plurality of devices into a Test-Logic Reset state, thereby causing the plurality of devices to read out the associated device identification codes; and shifting out the device identification codes from the plurality of devices.

13. The method according to claim 10, wherein storing the device specifications for each device comprises searching the database for device specifications associated with the device identification number associated using said each device, and downloading the device specifications when the database includes said device specifications for the associated device identification number.

14. The method according to claim 13, wherein storing the device specification further comprises prompting the user to enter said configuration data for said each device when the database fails to include said device specifications for the associated device identification number.

15. The method according to claim 10, wherein storing the configuration data comprises prompting the user to enter said configuration data for said each device.

16. A method for programming a plurality of in-system logic devices, the method comprising:

reading device identification codes from each of the plurality of devices;

reading device specifications from a database using the device identification codes;

prompting a user to enter configuration data for each of the configuration devices;

comparing the entered configuration data for each device with the device specifications corresponding to said each device; and programming the plurality of devices using the entered configuration data if the entered configuration data for each device is consistent with the specifications corresponding to said each device.

17. The method according to claim 16, wherein reading device specifications comprises causing the plurality of devices to transmit associated device identification codes.

18. The method according to claim 17, wherein the plurality of devices are connected in a Boundary-Scan chain, and wherein causing transmission of the device identification codes comprises:

setting the plurality of devices into a Test-Logic Reset state, thereby causing the plurality of devices to read out the associated device identification codes; and shifting out the device identification codes from the plurality of devices.

* * * * *